United States Patent
Gutman et al.

(10) Patent No.: US 10,473,460 B2
(45) Date of Patent: Nov. 12, 2019

(54) OVERLAY MEASUREMENTS OF OVERLAPPING TARGET STRUCTURES BASED ON SYMMETRY OF SCANNING ELECTRON BEAM SIGNALS

(71) Applicant: KLA-Tencor Corporation, Milpitas, CA (US)

(72) Inventors: Nadav Gutman, Zichron Ya'aqov (IL); Eran Amit, Haifa (IL); Stefan Eyring, Weilburg (DE); Hari Pathangi, Chennai (IN); Frank Laske, Weilburg (DE); Ulrich Pohlmann, Jena (DE); Thomas Heidrich, Weilburg (DE)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/979,336

(22) Filed: May 14, 2018

(65) Prior Publication Data
US 2019/0178639 A1    Jun. 13, 2019

Related U.S. Application Data

(60) Provisional application No. 62/597,093, filed on Dec. 11, 2017.

(51) Int. Cl.
*H01J 37/26* (2006.01)
*G01B 15/00* (2006.01)

(52) U.S. Cl.
CPC ............. *G01B 15/00* (2013.01); *H01J 37/26* (2013.01); *G01B 2210/56* (2013.01)

(58) Field of Classification Search
CPC ..... G01B 15/00; G01B 2210/56; H01J 37/26; H01J 37/261; H01J 37/263

USPC ............. 250/305, 306, 307, 309, 310, 311
See application file for complete search history.

(56) References Cited

U.S. PATENT DOCUMENTS

| | | | |
|---|---|---|---|
| 6,541,770 B1 | 4/2003 | Veneklasen | |
| 7,242,477 B2 | 7/2007 | Mieher et al. | |
| 7,541,201 B2 | 6/2009 | Ghinovker | |
| 8,330,281 B2 | 12/2012 | Ghinovker et al. | |
| 9,214,317 B2 | 12/2015 | Shur | |
| 9,476,698 B2 | 10/2016 | Abdulhalim et al. | |
| 9,927,718 B2 * | 3/2018 | Kandel | G03F 7/70683 |
| 10,002,743 B2 * | 6/2018 | Hotta | G01B 15/04 |

(Continued)

OTHER PUBLICATIONS

International Search Report and Written Opinion dated Mar. 29, 2019 for PCT/US2018/064641.

*Primary Examiner* — Nicole M Ippolito
(74) *Attorney, Agent, or Firm* — Suiter Swantz pc llo

(57) ABSTRACT

An overlay metrology system includes a particle-beam metrology tool to scan a particle beam across an overlay target on a sample including a first-layer target element and a second-layer target element. The overlay metrology system may further include a controller to receive a scan signal from the particle-beam metrology tool, determine symmetry measurements for the scan signal with respect to symmetry metrics, and generate an overlay measurement between the first layer and the second layer based on the symmetry measurements in which an asymmetry of the scan signal is indicative of a misalignment of the second-layer target element with respect to the first-layer target element and a value of the overlay measurement is based on the symmetry measurements.

35 Claims, 8 Drawing Sheets

(56) References Cited

U.S. PATENT DOCUMENTS

| | | |
|---|---|---|
| 2004/0169861 A1 | 9/2004 | Mieher |
| 2005/0089773 A1 | 4/2005 | Shur et al. |
| 2007/0008533 A1 | 1/2007 | Ghinovker |
| 2013/0035888 A1 | 2/2013 | Kandel et al. |
| 2015/0115154 A1 | 4/2015 | Kim et al. |
| 2015/0285627 A1 | 10/2015 | Yamaguchi et al. |
| 2015/0287569 A1 | 10/2015 | Yamamoto et al. |

* cited by examiner

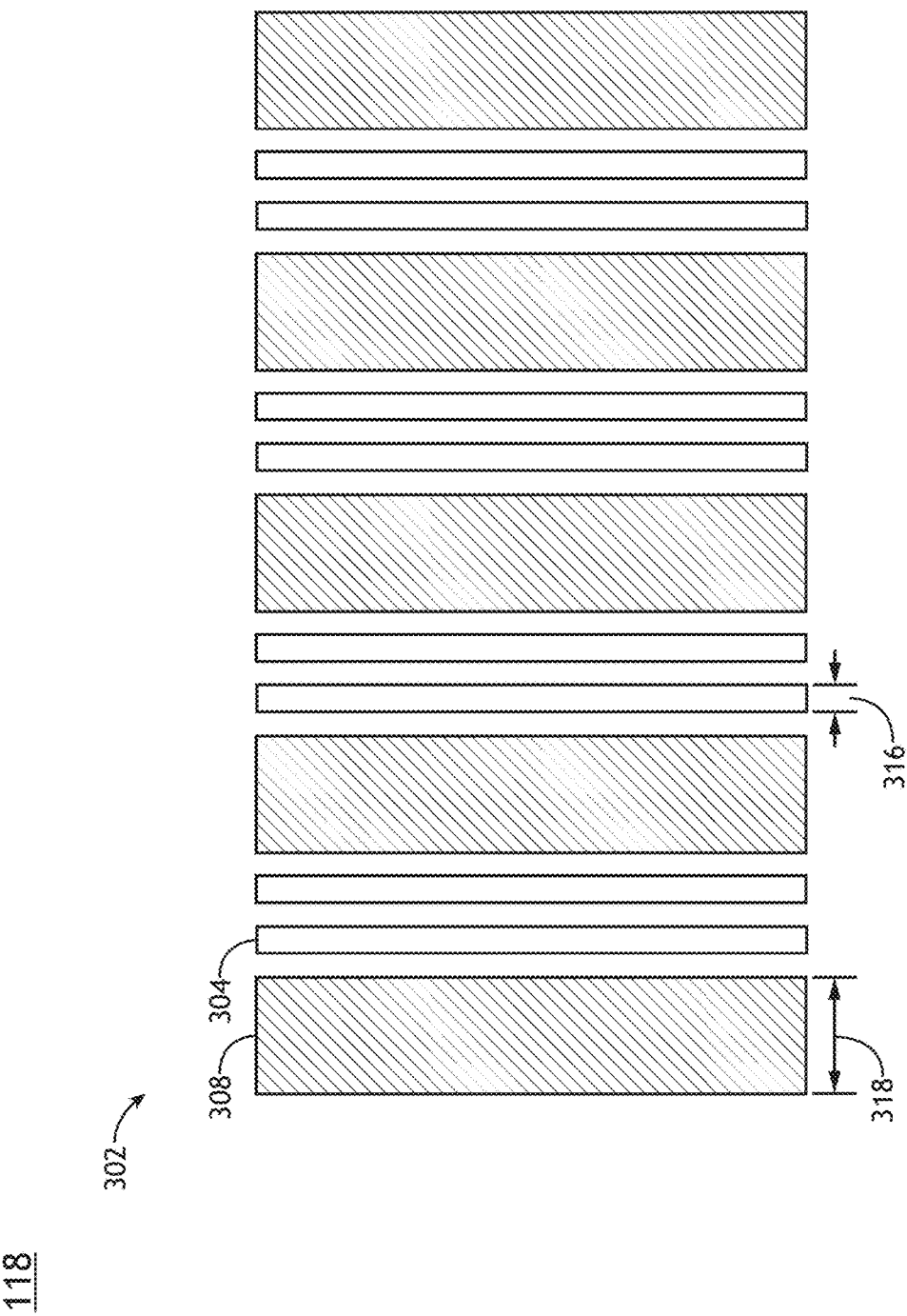

OVERLAY MEASUREMENTS OF OVERLAPPING TARGET STRUCTURES BASED ON SYMMETRY OF SCANNING ELECTRON BEAM SIGNALS

TECHNICAL FIELD

The present disclosure relates generally to overlay metrology and, more particularly, to scanning electron microscope overlay metrology.

BACKGROUND

Semiconductor fabrication typically requires fabricating multiple layers on a structure in which some or all of the layers include patterned features. Overlay metrology is the measurement of the relative positions of structures on various layers of a sample, which are critical to the performance of a fabricated device and must typically be controlled within tight tolerances. For example, overlay metrology may measure the relative positions of features on different sample layers as a measure of the layer-by-layer alignment of fabrication tools.

Overlay measurements are commonly performed on dedicated overlay targets having features designed for sensitive overlay measurements rather than directly on device features. Features on different layers of overlay targets are commonly spatially separated to avoid overlap and facilitate measurements of features on buried layers. For example, an overlay target element on one layer may impact a measurement of an overlay target element on a previously-fabricated layer. However, open areas associated with spatially separated target elements may not be compatible with microelectronics fabrication. Further, device features commonly include stacked structures such that overlay measurements of spatially separated overlay target elements may introduce measurement errors.

It is therefore desirable to provide systems and methods for measuring overlay on stacked overlay target elements.

SUMMARY

An overlay metrology system is disclosed in accordance with one or more illustrative embodiments of the present disclosure. In one illustrative embodiment, the system includes a controller communicatively coupled to a particle-beam metrology tool in which the particle-beam metrology tool scans a particle beam across an overlay target on a sample in which the overlay target includes a first-layer target element on a first layer of the sample and a second-layer target element on a second layer of the sample. In another illustrative embodiment, the particle-beam metrology tool captures a scan signal associated with interaction of the particle beam with both the first-layer target element and the second-layer target element. In another illustrative embodiment, the controller receives the scan signal from the particle-beam metrology tool. In another illustrative embodiment, the controller determines one or more symmetry measurements for the scan signal with respect to one or more symmetry metrics. In another illustrative embodiment, the controller generates an overlay measurement between the first layer and the second layer based on the one or more symmetry measurements in which an asymmetry of the scan signal is indicative of a misalignment of the second-layer target element with respect to the first-layer target element and a value of the overlay measurement is based on the one or more symmetry measurements.

An overlay metrology method is disclosed in accordance with one or more illustrative embodiments of the present disclosure. In one illustrative embodiment, the method includes scanning a particle beam across an overlay target on a sample in which the overlay target includes a first-layer target element on a first layer of the sample and a second-layer target element on a second layer of the sample. In another illustrative embodiment, the method includes capturing a scan signal associated with interaction of the particle beam with both the first-layer target element and the second-layer target element. In another illustrative embodiment, the method includes determining one or more symmetry measurements for the scan signal with respect to one or more symmetry metrics. In another illustrative embodiment, the method includes generating an overlay measurement between the first layer and the second layer based on the one or more symmetry measurements in which an asymmetry of the scan signal is indicative of a misalignment of the second-layer target element with respect to the first-layer target element and a value of the overlay measurement is based on the one or more symmetry measurements. In another illustrative embodiment, the method includes providing overlay correctables based on the value of the overlay measurement to a lithography system to modify exposure conditions of at least one subsequent exposure.

An overlay metrology system is disclosed in accordance with one or more illustrative embodiments of the present disclosure. In one illustrative embodiment, the system includes a particle-beam metrology tool to scan a particle beam across an overlay target on a sample in which the overlay target includes a first-layer target element on a first layer of the sample and a second-layer target element on a second layer of the sample. In another illustrative embodiment, the particle-beam metrology tool further captures a scan signal associated with interaction of the particle beam with both the first-layer target element and the second-layer target element. In another illustrative embodiment, the system includes a controller coupled to the particle-beam metrology tool. In another illustrative embodiment, the controller receives the scan signal from the particle-beam metrology tool. In another illustrative embodiment, the controller determines one or more symmetry measurements for the scan signal with respect to one or more symmetry metrics. In another illustrative embodiment, the controller generates an overlay measurement between the first layer and the second layer based on the one or more symmetry measurements in which an asymmetry of the scan signal is indicative of a misalignment of the second-layer target element with respect to the first-layer target element and a value of the overlay measurement is based on the one or more symmetry measurements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3A is a top view of a two-layer overlay metrology target including stacked overlay target features, in accordance with one or more embodiments of the present disclosure.

DETAILED DESCRIPTION

Figure 1A:
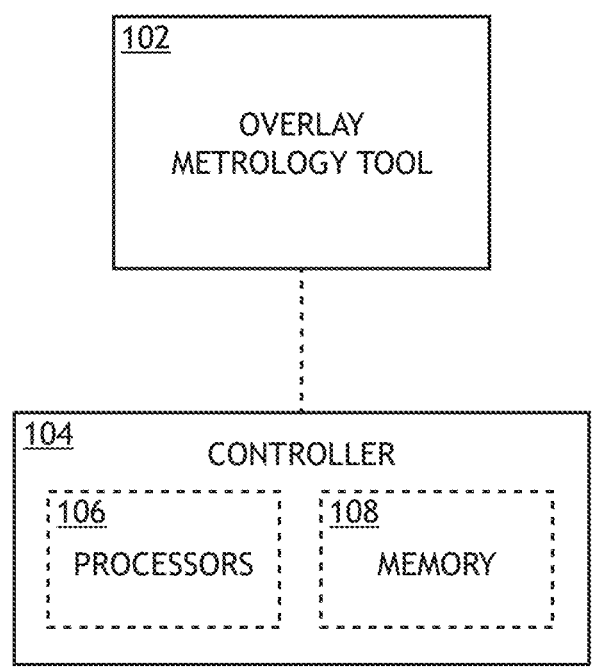
FIG. 1A is a conceptual view of an overlay metrology system suitable for device-correlated metrology measurements, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to determining overlay by scanning a particle beam (e.g., an electron beam, an ion beam, or the like) across stacked overlay target elements located on two sample layers, capturing a corresponding scan signal from the target elements, and determining the relative positions of the overlay target elements based on the symmetry of the scan signal.

For example, a particle-beam metrology tool such as, but not limited to, a scanning electron microscope (SEM) metrology tool (e.g., a critical dimension SEM (CD-SEM), or the like), or a focused ion beam (FIB) metrology tool may scan a particle beam across a portion of an overlay target and detect emission from the sample in response to the particle beam. The emission may include various types of particles and/or radiation emanating from the sample in response to the particle beam such as, but not limited to, backscattered emission of the particle beam, secondary emission (e.g., secondary electron emission, or the like), or electromagnetic radiation (e.g., light). Further, a particle beam may interact with and thus characterize target elements on multiple layers of the sample based on the interaction volume, which is at least partially determined by the energy of the particle beam. For instance, low-energy particle beams may be used to characterize a surface layer, while relatively higher-energy particle beams may penetrate deeper into the sample to characterize features on previously-fabricated layers.

A semiconductor device may by formed as multiple printed layers of patterned material on a substrate. Each patterned layer may be fabricated through a series of process steps such as, but not limited to, one or more material deposition steps, one or more lithography steps, or one or more etching steps. Further, each patterned layer must typically be fabricated within specific tolerances to properly construct the final device. For example, printing characteristics such as, but not limited to, the overlay associated with the registration or relative placement of elements between layers must be well characterized and controlled. Accordingly, overlay targets may be fabricated on one or more patterned layers at multiple locations across a sample to enable efficient characterization of the fabrication process. In this regard, deviations of printed characteristics of overlay target elements on a patterned layer may be representative of deviations of printed characteristics of all elements on the layer including device features forming a portion of the semiconductor device. However, differences in size, orientation, density, and/or location on the sample of overlay targets relative to the device features may introduce a mismatch between measured overlay at the target and actual overlay of device features. Ensuring device-relevant overlay measurements on overlay targets is thus an ongoing challenge in overlay metrology.

Embodiments of the present disclosure are directed to measuring overlay on dedicated overlay targets having device-scale features. In this regard, the elements of the overlay target may have features such as, but not limited to, size, shape, orientation, or density that are similar to corresponding device features. Accordingly, the device structures of interest and the overlay target may print with substantially similar characteristics, which may mitigate target-to-device errors.

Additional embodiments of the present disclosure are directed to measuring overlay on overlay targets including nominally stacked or overlapping elements on layers of interest. In this regard, the overlay targets may avoid large open areas, which may not be compatible with semiconductor design rules. Further, overlay targets including stacked target elements may facilitate an even field of view and even surface charging in a particle-based metrology tool to mitigate beam placement distortion and associated measurement errors.

For example, the overlay of a stacked overlay target may be based on the relative positions between target elements on the layers of interest. Further, stacked overlay targets may be fabricated such that a nominal overlay (e.g., no misregistration between sample layers) corresponds to any selected distribution of target elements on the layers of interest. For example, a stacked overlay target may be fabricated such that a nominal overlay corresponds to a symmetric configuration of target elements in which target elements on a surface layer are fabricated directly above target in a sub-surface layer (e.g., lines of symmetry of features in the surface layer align with lines of symmetry of features in the sub-surface layers). By way of another example, a stacked overlay target may be fabricated such that a nominal overlay corresponds to an asymmetric configuration of target elements in which target elements on a surface layer are fabricated with a selected asymmetric offset with respect to target elements on a sub-surface layer.

It is recognized herein that sample emission associated with particle beam interactions with stacked overlay target elements may include multiple emission sources associated with target elements on multiple layers of the sample. For example, an electron beam interacting with stacked overlay target features may simultaneously induce both backscattered emission and secondary emission from target elements on multiple sample layers such that distinguishing the source of detected emission may be challenging. Additional embodiments of the present disclosure are directed to detecting overlay based on the symmetry of a scan signal across one or more stacked overlay target elements. For instance, an emission signal of symmetrically aligned target structures across multiple layers may also be symmetric. Conversely, an emission signal of asymmetrically aligned target structures may be asymmetric. Accordingly, the symmetry of a scan signal may provide a measurement of the symmetry of the underlying features and thus the relative positions of target features suitable for determining overlay.

Additional embodiments of the present disclosure are directed to extracting a value of overlay (e.g., a value of a misregistration between overlay target structures on multiple layers based on one or more symmetry metrics). For example, symmetry metrics may include, but are not limited to, a number of peaks in the scan signal, values of the peaks in the scan signal, locations of peaks of the scan signal with respect to a center of an overlay target structure, separation distances of scan signal peaks, or the integral of the scan signal. Further embodiments are directed to correlating the symmetry metrics to overlay values. For example, calibration scan signals may be generated for a calibration overlay target having overlay target features on multiple layers with known asymmetric offsets. The calibration scan signals and the corresponding known asymmetric offsets may then be used to generate correlations between symmetry characteristics of the scan signals and overlay measurements such that an overlay measurement may be extracted from an arbitrary scan signal based on the correlations. Further, the correlations may be generated using any method known in the art such as, but not limited to, pattern recognition techniques, principal component analysis, or machine learning techniques.

Additional embodiments of the present disclosure are directed to generating overlay correctables based on the overlay measurements. The overlay correctables may then be provided to fabrication tools (e.g., lithography tools) as feedback and/or feedforward data. For example, overlay measurements associated with a current process step measured on a sample may be used to compensate for drifts and maintain overlay within selected tolerances for the process step on subsequent samples in the same or subsequent lots. By way of another example, overlay measurements associated with a current process step may be fed-forward to adjust subsequent process steps to compensate for any measured overlay errors.

FIG. 1A is a conceptual view of an overlay metrology system 100 suitable for device-correlated metrology measurements, in accordance with one or more embodiments of the present disclosure. In one embodiment, the overlay metrology system 100 include at least one overlay metrology tool 102 suitable for measuring intra-layer pattern placement distances as well as inter-layer overlay measurements of stacked overlay target features.

In another embodiment, the overlay metrology system 100 includes a controller 104. In another embodiment, the controller 104 includes one or more processors 106 configured to execute program instructions maintained on a memory medium 108. In this regard, the one or more processors 106 of controller 104 may execute any of the various process steps described throughout the present disclosure. For example, the controller 104 may receive data from the overlay metrology tool 102 and may further generate device-correlated overlay data. By way of another example, the controller 104 may generate device-relevant overlay correctables based on data from the overlay metrology tool 102.

Further, the controller 104 may be communicatively coupled to one or more external fabrication tools such as, but not limited to, a lithography tool. In this regard, the controller 104 may operate as an advanced process controller (APC) suitable for controlling the inputs of the external fabrication tools to maintain overlay within selected overlay tolerances.

The one or more processors 106 of a controller 104 may include any processing element known in the art. In this sense, the one or more processors 106 may include any microprocessor-type device configured to execute algorithms and/or instructions. In one embodiment, the one or more processors 106 may consist of a desktop computer, mainframe computer system, workstation, image computer, parallel processor, or any other computer system (e.g., networked computer) configured to execute a program configured to operate the overlay metrology system 100, as described throughout the present disclosure. It is further recognized that the term "processor" may be broadly defined to encompass any device having one or more processing elements, which execute program instructions from a non-transitory memory medium 108. Further, the steps described throughout the present disclosure may be carried out by a single controller 104 or, alternatively, multiple controllers. Additionally, the controller 104 may include one or more controllers housed in a common housing or within multiple housings. In this way, any controller or combination of controllers may be separately packaged as a module suitable for integration into overlay metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory, a random access memory, a magnetic or optical memory device (e.g., disk), a magnetic tape, a solid state drive, and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet, and the like). Therefore, the above description should not be interpreted as a limitation on the present invention but merely an illustration.

By way of another example, the overlay metrology tool 102 may scan a focused beam across the sample and capture radiation and/or particles emanating from the sample on one or more detectors at one or more measurement angles to generate the image. The focused beam may be scanned across the sample by modifying the beam path (e.g., using a galvo mirror, a piezo-electric mirror, or the like) and/or by translating the sample through a focal volume of the focused beam.

Figure 1B:
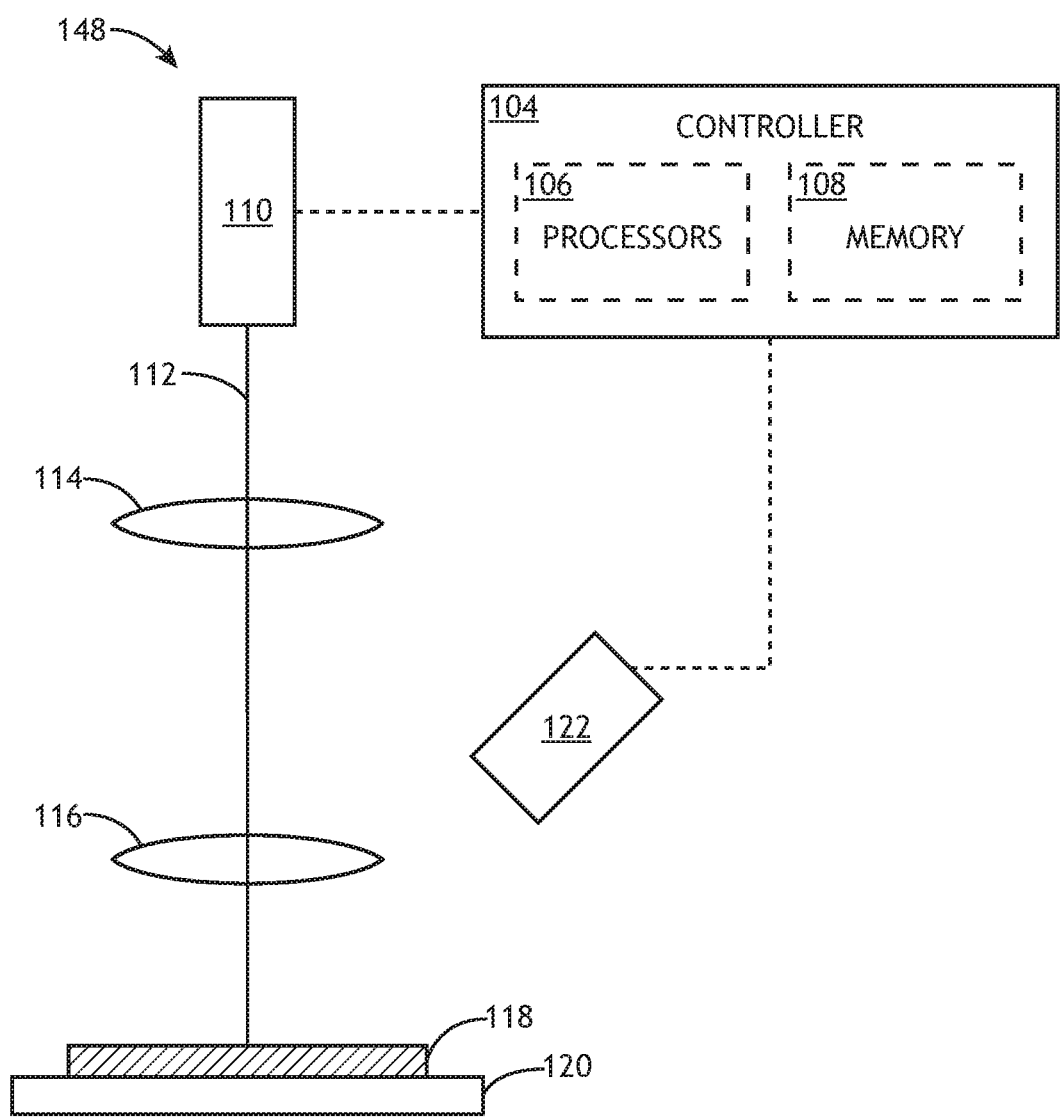
FIG. 1B is a conceptual view of a particle-based overlay metrology tool, in accordance with one or more embodiments of the present disclosure.

FIG. 1B is a conceptual view of a particle-based overlay metrology tool 102, in accordance with one or more embodiments of the present disclosure. The overlay metrology tool 102 may include any type of metrology tool suitable for resolving device features or device-scale features such as, but not limited to an electron-beam metrology tool (e.g., a SEM, a CD-SEM, or the like), or an ion-beam metrology tool (e.g., a focused-ion-beam (FIB) metrology tool.

In one embodiment, the overlay metrology tool 102 includes a particle source 110 (e.g., an electron beam source, an ion beam source, or the like) to generate a particle beam 112 (e.g., an electron beam, a particle beam, or the like). The particle source 110 may include any particle source known in the art suitable for generating a particle beam 112. For example, the particle source 110 may include, but is not limited to, an electron gun or an ion gun. In another embodiment, the particle source 110 is configured to provide a particle beam with a tunable energy. For example, particle source 110 including an electron source may, but is not required to provide, an accelerating voltage in the range of 0.1 kV to 30 kV. As another example, a particle source 110 including an ion source may provide, but is not required to provide, an ion beam with an energy in the range of 1 to 50 keV.

In another embodiment, the overlay metrology tool 102 includes one or more particle focusing elements 114. For example, the one or more particle focusing elements 114 may include, but are not limited to, a single particle focusing element or one or more particle focusing elements forming a compound system. In another embodiment, the one or more particle focusing elements 114 include a particle objective lens 116 configured to direct the particle beam 112 to a sample 118 located on a sample stage 120. Further, the one or more particle focusing elements 114 may include any type of electron lenses known in the art including, but not limited to, electrostatic, magnetic, uni-potential, or double-potential lenses.

In another embodiment, the overlay metrology tool 102 includes one or more detectors 122 to image or otherwise detect particles emanating from the sample 118. In one embodiment, the detectors 122 includes an electron collector (e.g., a secondary electron collector, a backscattered electron detector, or the like). In another embodiment, the detectors 122 includes a photon detector (e.g., a photodetector, an x-ray detector, a scintillating element coupled to photomultiplier tube (PMT) detector, or the like) for detecting electrons and/or photons from the sample 118.

In another embodiment, though not shown, the overlay metrology tool 102 includes one or more collection lenses to capture emission from the sample 118 and direct it to the one or more detectors 122. For example, the objective lens 116 may operate as a collection lens to collect emission from the sample. Further, one or more collection elements (e.g., one or more additional lenses, a beam deflector, or the like) may direct the emission to the one or more detectors 122.

It is to be understood that the description of an overlay metrology tool 102 as depicted in FIG. 1B and the associated descriptions above are provided solely for illustrative purposes and should not be interpreted as limiting. For example, the overlay metrology tool 102 may include a multi-beam and/or a multi-column system suitable for simultaneously interrogating a sample 118. In a further embodiment, the overlay metrology tool 102 may include one or more components (e.g., one or more electrodes) configured to apply one or more voltages to one or more locations of the sample 118. In this regard, the overlay metrology tool 102 may generate voltage contrast imaging data.

It is recognized herein that the penetration depth of the particle beam 112 in the sample 118 may depend on the particle energy such that higher-energy beams typically penetrate deeper into the sample. In one embodiment, the overlay metrology tool 102 utilizes different particle energies to interrogate different layers of the device based on the penetration depth of the particle beam 112 into the sample 118. For example, the overlay metrology tool 102 may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

Figure 2:
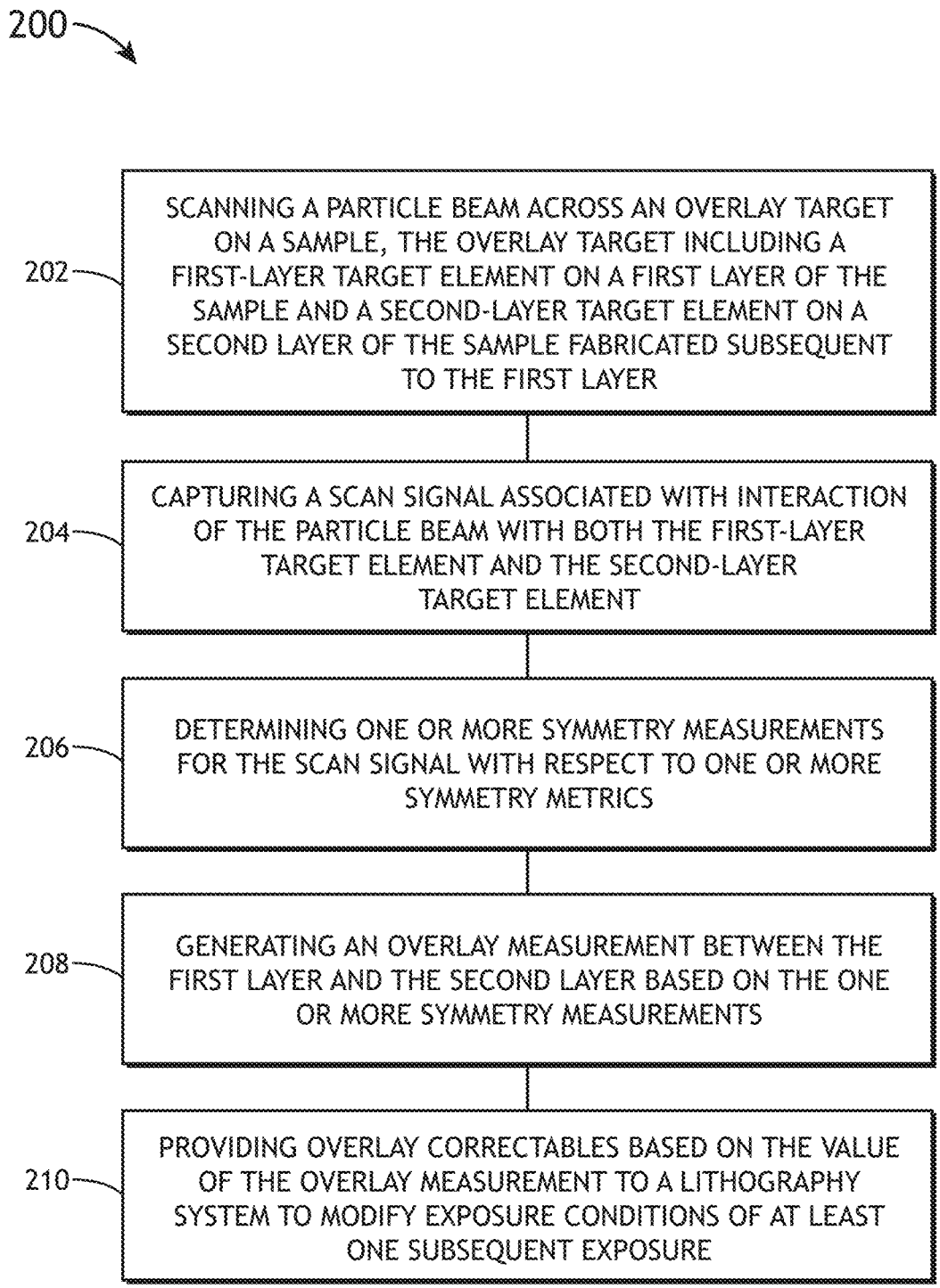
FIG. 2 is a flow diagram illustrating steps performed in an overlay metrology method, in accordance with one or more embodiments of the present disclosure.

FIG. 2 is a flow diagram illustrating steps performed in an overlay metrology method 200, in accordance with one or more embodiments of the present disclosure. Applicant notes that the embodiments and enabling technologies described previously herein in the context of the overlay metrology system 100 should be interpreted to extend to method 200. It is further noted, however, that the method 200 is not limited to the architecture of the overlay metrology system 100.

In one embodiment, the method 200 includes a step 202 of scanning a particle beam across an overlay target on a sample where the overlay target includes a first-layer target element on a first layer of the sample and a second-layer target element on a second layer of the sample fabricated subsequent to the first layer.

Figure 3B:
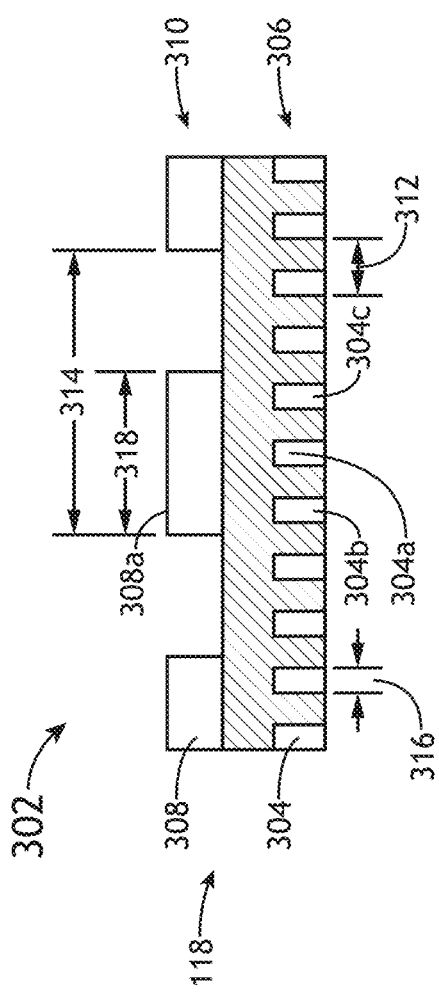
FIG. 3B is a profile view of a two-layer overlay metrology target including stacked overlay target features, in accordance with one or more embodiments of the present disclosure.

FIGS. 3A and 3B illustrate an overlay target having stacked overlay target features, in accordance with one or more embodiments of the present disclosure. Specifically, FIG. 3A is a top view of a two-layer overlay metrology target 302 including stacked overlay target features, in accordance with one or more embodiments of the present disclosure. Further, FIG. 3B is a profile view of the two-layer overlay metrology target 302 including stacked overlay target features, in accordance with one or more embodiments of the present disclosure. In one embodiment, the overlay metrology target 302 includes first-layer target elements 304 on a first layer 306 of a sample 118 and further includes second-layer target elements 308 on a second layer 310 of the sample 118. For example, the second layer 310 may be fabricated subsequent to the first layer 306 and may represent a current fabrication layer. It may be the case that one or more additional layers may be fabricated on the second-layer target elements 308 in subsequent fabrication steps.

Target elements on a given layer of an overlay target may have any size, shape, orientation, or distribution suitable for measuring overlay between two or more layers of the sample. For example, as illustrated in FIGS. 3A and 3B, the first-layer target elements 304 may be periodically distributed with a first-layer pitch 312 and the second-layer target elements 308 may be distributed with a second-layer pitch 314. Further, the first-layer target elements 304 may have a first-layer element width 316, while the second-layer target elements 308 may have a second-layer element width 318. In addition, the periods and/or the widths of target features on different layers may be the same or may differ. For instance, as illustrated in FIGS. 3A and 3B, the second-layer pitch 314 is three times larger than the first-layer pitch 312. Additionally, the second-layer element width 318 is over three times larger than the first-layer element width 316 such that each second-layer target element 308 overlaps three first-layer target elements 304.

In one embodiment, the target features on one or more layers of an overlay target may have sizes, shapes, orientations, or distributions representative of device features on the corresponding layers. In this regard, the overlay target features may be fabricated with substantially the same characteristics (e.g., pattern placement error, sidewall angle, critical dimension, or the like) as the corresponding device features such that overlay measured on the overlay target may accurately represent the overlay of corresponding device features on the sample. For example, the target feature pitch (e.g., the first-layer pitch 312, the second-layer pitch 314, or the like) and/or the target feature width (e.g., the first-layer element width 316, the second-layer element width 318, or the like) may be representative of device features. It is recognized herein that device features on a given layer of the sample may have varied sizes, shapes, orientations, or distributions. Accordingly, device-scale overlay target elements may have dimensions representative of at least some of the device features of interest.

The target elements on a given layer may be stacked in any configuration suitable for determining overlay between two or more layers of the sample. In one embodiment, at least some target elements on adjacent sample layers are fabricated in a nominally-symmetric configuration. In this regard, overlay between sample layers may be identified based on a break in the symmetry (e.g., by asymmetric fabrication).

For example, as illustrated in the profile view of FIG. 3B, the second-layer target element 308a may be fabricated directly above the first-layer target element 304a (and symmetrically above the group of first-layer target elements 304a-c) in a symmetric configuration that may represent, but is not required to represent, a nominal overlay associated with zero misregistration between the first layer 306 and the second layer 310. Accordingly, a misregistration between the first layer 306 and the second layer 310 along the separation direction of the target features (e.g., the X-direction in FIGS. 3A and 3B) may manifest as a break in the symmetry of the second-layer target elements 308 with respect to the first-layer target elements 304. Further, the break in the symmetry of the second-layer target elements 308 with respect to the first-layer target elements 304 may be characterized by an asymmetric offset indicative of the value of the misregistration between the second-layer target elements 308 with respect to a symmetric configuration.

It is to be understood, however, that the overlay metrology target 302 illustrated in FIGS. 3A and 3B, along with the associated descriptions, is provided solely for illustrative purposes and should not be interpreted as limiting. For example, an overlay target may have a single target element in one or more layers such that the target elements on adjacent layers of interest for an overlay measurement may be stacked. By way of another example, the second-layer element width 318 may be smaller than the first-layer element width 316 such that a portion of the first-layer target elements 304 may be visible from a top view. By way of another example, the second-layer pitch 314 may be equal to or smaller than the first-layer pitch 312. By way of another example, overlay target features on a given layer may have varying sizes, shapes, orientations, and/or distributions so long as symmetry is preserved between layers of interest.

The step 202 may include scanning any type of particle beam across the overlay target (e.g., overlay metrology target 302). For example, the particle beam may be, but is not required to be, generated using the particle-based overlay metrology tool 102. Accordingly, the particle beam (e.g., particle beam 112, or the like) may include, but is not limited to, an electron beam, an ion beam (e.g., a proton beam, or the like), or a beam of neutral particles.

Further, the step 202 may include scanning the particle beam over one or more target elements of the overlay target such that the particle beam interacts with target elements on multiple layers of interest. As described previously herein, the interaction volume and/or the interaction depth of a particle beam (e.g., particle beam 112, or the like) may be a function of at least the beam energy, with the penetration depth of the particle beam increasing with the beam energy.

For example, referring again to FIGS. 3A and 3B, the step 202 may include scanning the particle beam over at least the second-layer target element 308a with a sufficient beam energy to interact with the first-layer target elements 304a-c.

In another embodiment, the method 200 includes a step 204 of capturing a scan signal associated with interaction of the particle beam with both the first-layer target element and the second-layer target element. For example, the step 204 may include capturing a scan signal associated with emission detected from the sample in response to the scanned particle beam in step 202. Further, the scan signal may be generated based on multiple types of emission generated in response to scanning the sample with the particle beam such as, but not limited to, backscattered emission (BSE) of the particle beam or secondary emission (SE) of particles and/or electromagnetic radiation (e.g., light).

Figure 4:
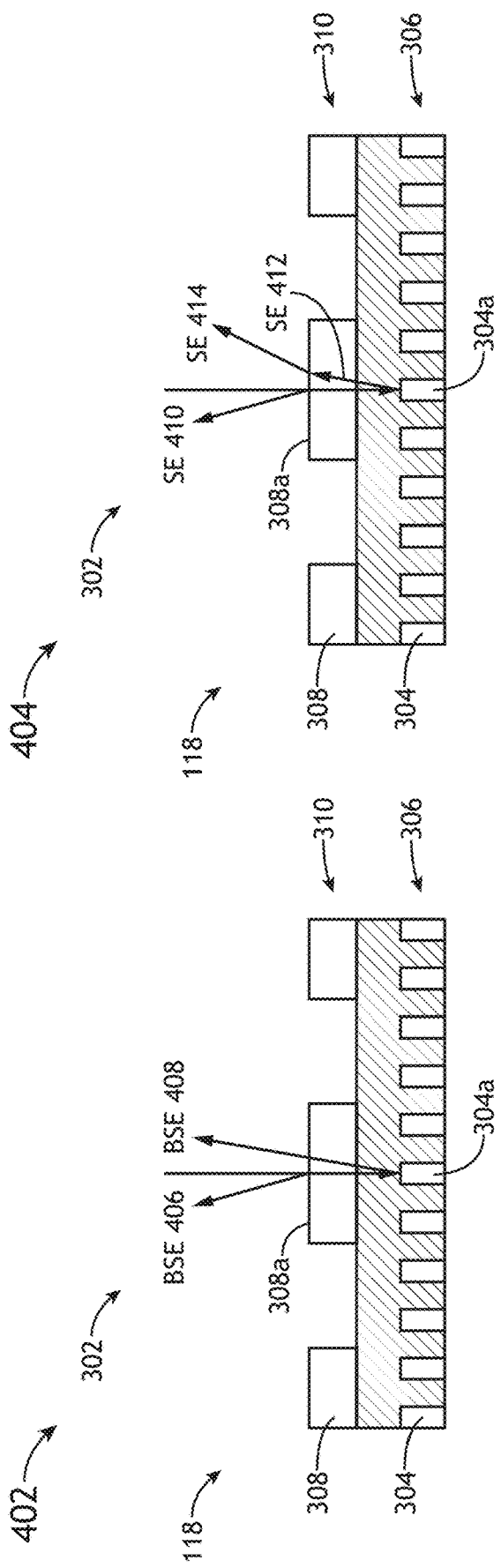
FIG. 4 includes profile views of the multiple sources of emission from an overlay metrology target in response to an incident particle beam, in accordance with one or more embodiments of the present disclosure.

FIG. 4 includes profile views of the multiple sources of emission from the overlay metrology target 302 in response to an incident particle beam 112, in accordance with one or more embodiments of the present disclosure. Profile view 402 illustrates some possible sources of backscattered emission associated with reflection of the particle beam 112 in the sample (e.g., associated with elastic scattering of the particle beam 112), and profile view 404 illustrates some possible sources of secondary emission induced by the absorption of the particle beam 112 in the sample 118.

In one embodiment, the particle beam 112 includes an electron beam (e.g., generated by a scanning electron microscope metrology system). The interaction with of the particle beam 112 may then generate numerous emission signals from the sample. For example, the particle beam 112 may generate second-layer BSE 406 based on interaction with the second-layer target element 308a and/or first-layer BSE 408 based on interaction with the first-layer target element 304a after passing through the second layer 310. By way of another example, the particle beam 112 may induce the generation of secondary electrons (SE) from multiple sources. For instance, the particle beam 112 may generate second-layer SE 410 from the second-layer target element 308a. In another instance, the particle beam 112 may generate first-layer SE 412 from the first-layer target element 304a after passing through the second layer 310. In another instance, as illustrated in FIG. 4, additional second-layer SE 414 may be generated in the second layer 310 upon absorption of a portion of the first-layer BSE 408 generated in the first layer 306 and propagating back towards the surface.

The emission generated in response the particle beam 112 may be captured in step 202 by any number of detectors suitable for capturing the emission of interest. For example, the emission may be captured by at least one detector 122 of the overlay metrology system 100. Further, any of the detectors 122 may generate a scan signal associated with the intensity of the captured signal as a function of position of the particle beam 112 across the sample during a scan.

In another embodiment, the method 200 includes a step 206 of determining one or more symmetry measurements for the scan signal with respect to one or more symmetry metrics. In another embodiment, the method 200 includes a step 208 of generating an overlay measurement between the first layer and the second layer based on the one or more symmetry measurements, wherein an asymmetry of the scan signal is indicative of a misalignment of the second-layer target element with respect to the first-layer target element, wherein a value of the overlay measurement is based on the one or more symmetry measurements. The step 206 of determining one or more symmetry measurements for the scan signal and/or the step 208 may be, but are not required to be, performed using the controller 104 of the overlay metrology system 100. For example, the controller 104 may be communicatively coupled to the detectors 122 to receive the scan signals and may further analyze the scan signals to analyze the symmetry of the scan signals and further generate an overlay measurement based on the symmetry measurements.

It is recognized herein that a detector (e.g., a detector 122) may simultaneously capture multiple sources of emission from the sample (e.g., any combination of the first-layer BSE 408, the second-layer BSE 406, the first-layer SE 412, the second-layer SE 410, and/or the additional second-layer SE 414). However, it may be the case that the symmetry or asymmetry of a scan signal including emission of any combination of sources may reflect the underlying symmetry or asymmetry of the sample features scanned by the particle beam. Accordingly, the step 206 may characterize the scan signals by determining symmetry measurements with respect to any number of symmetry metrics. Further, the step 208 may determine an overlay measurement based on the symmetry measurements.

For example, the presence of a non-zero overlay (e.g., a misregistration of sample layers) may be identified based on a deviation of the symmetry measurements of scan signals from nominal symmetry measurements. For example, a non-zero overlay may correspond to a symmetric configuration of overlay target elements or a selected asymmetric configuration associated with a selected asymmetric offset. Further, an overlay measurement value including a magnitude and/or direction of a misregistration between sample layers may be generated based on an analysis of the scan signals with respect to one or more symmetry metrics.

In one embodiment, an overlay measurement value may be generated with respect to a calibration dataset providing a mapping between known asymmetric offsets (e.g., known deviations of target features on sample layers of interest from a symmetric configuration) and corresponding scan signals. For example, one or more calibration samples may be fabricated with stacked overlay target elements corresponding to an overlay target to be measured (e.g., overlay metrology target 302, or the like) arranged with systematically-varying asymmetry offsets between sample layers of interest. Further, calibration scan signals associated with each known asymmetry offset may be generated with the overlay metrology tool (e.g., the overlay metrology tool 102). Symmetry measurements associated with the calibration scan signals may thus be analyzed to generate a mapping between symmetry measurements and known asymmetry offsets. Accordingly, the calibration dataset may be used to map scan signals measured on any sample of interest to an asymmetry offset.

The asymmetry offsets may then be correlated to overlay values. For example, the sensitivity of scan signals to deviations of asymmetry offsets of corresponding target features may vary for different offsets. Accordingly, an overlay target may be fabricated with any selected asymmetry offset between target features on sample layers of interest to provide a desired sensitivity.

Figure 5A:
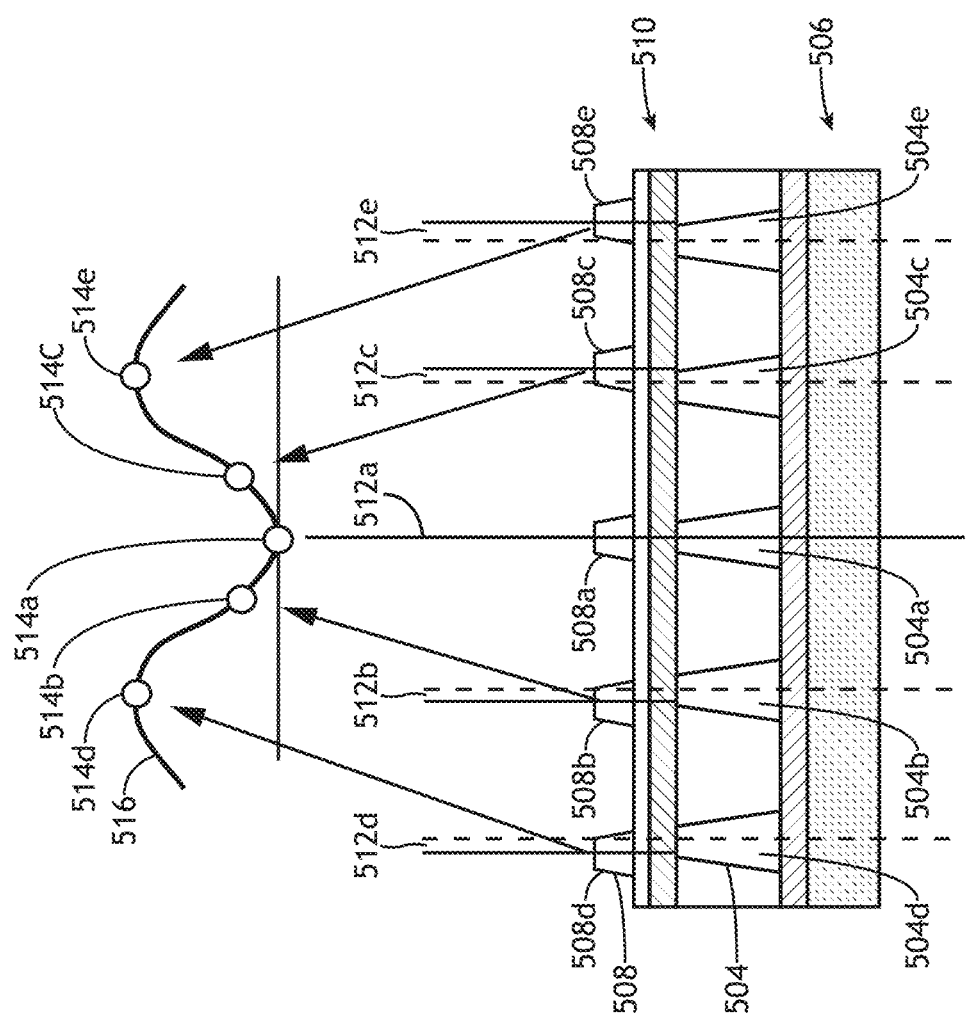
FIG. 5A is a profile view of a calibration sample having systematically-varying known asymmetry offsets, in accordance with one or more embodiments of the present disclosure.

FIG. 5A is a profile view of a calibration sample having systematically-varying known asymmetry offsets, in accordance with one or more embodiments of the present disclosure. In one embodiment, the calibration sample includes first-layer calibration target elements 504 on a first layer 506 of the calibration sample and further includes second-layer calibration target elements 508 on a second layer 510 of the calibration sample. Further, the calibration target elements (e.g., the first-layer calibration target elements 504, the second-layer calibration target elements 508, and the like) may have substantially the same size, shape, and orientation as overlay target elements on a corresponding overlay target of interest (e.g., the overlay metrology target 302, or the like). In this regard, the calibration overlay target elements may be fabricated with substantially the same characteristics (e.g., pattern placement error, critical dimension, sidewall angles, or the like) as the corresponding overlay target.

The calibration target elements may be fabricated with systematically-varying known asymmetry offsets (e.g., deviations of the locations of target elements on the second layer 510 from a symmetric configuration with respect to target elements on the first layer 506). For example, as illustrated in FIG. 5A, a second-layer calibration target element 508a may be symmetrically fabricated above a corresponding first-layer calibration target element 504a with a null asymmetry offset 512a, second-layer calibration target elements 508b,c may be symmetrically fabricated above corresponding first-layer calibration target element 504b,c with equal and opposite asymmetry offsets 512b,c (e.g., asymmetries), second-layer calibration target elements 508d,e may be symmetrically fabricated above corresponding first-layer calibration target element 504d,e with equal and opposite asymmetry offsets 512d,e, and so on.

Figure 5B:
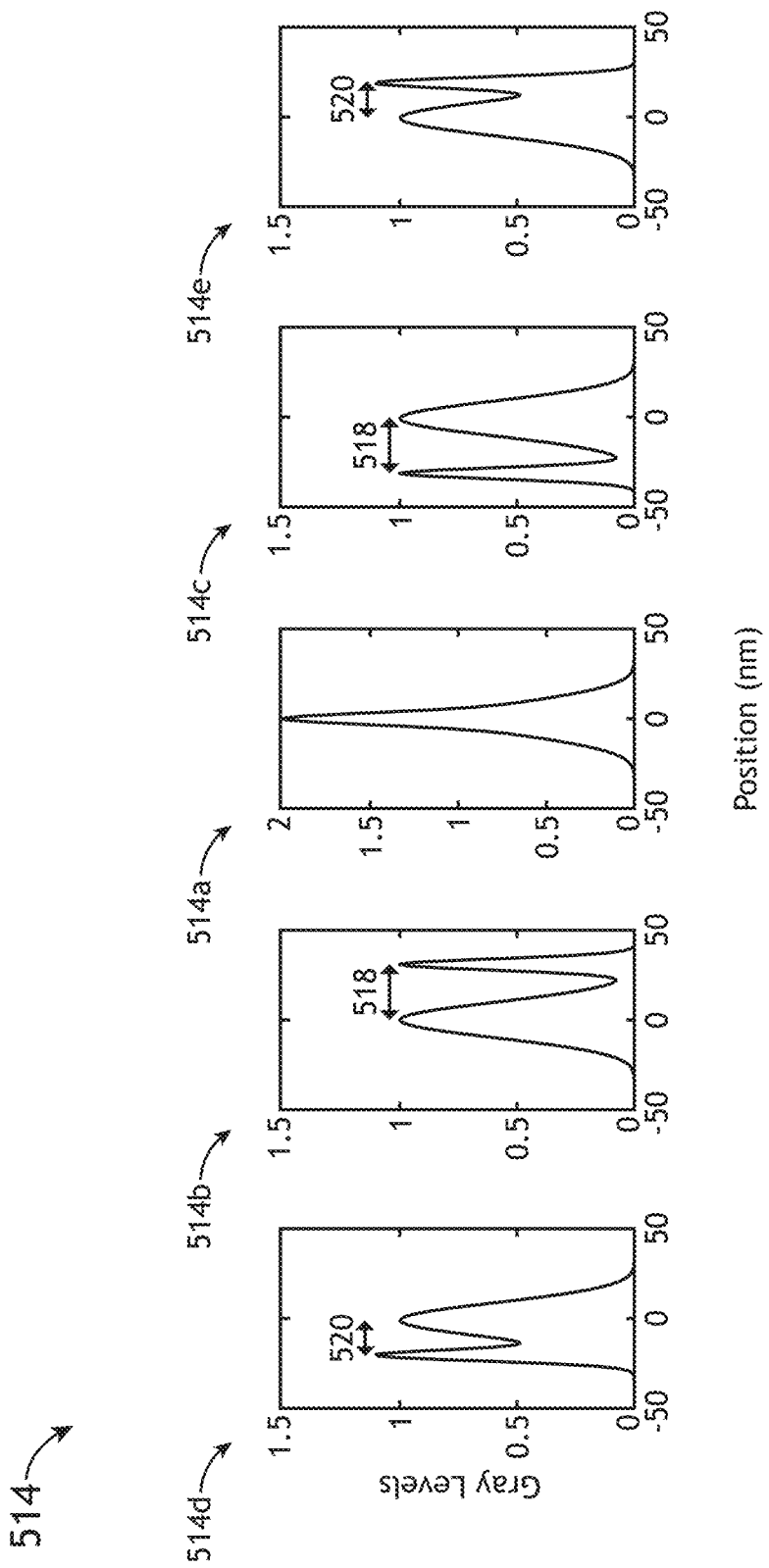
FIG. 5B includes calibration scan signals associated with the calibration target elements of FIG. 5A, in accordance with one or more embodiments of the present disclosure.

FIG. 5B includes calibration scan signals 514 associated with the calibration target elements of FIG. 5A, in accordance with one or more embodiments of the present disclosure. For example, the calibration scan signal 514a may correspond to the first calibration target element 504a and the second calibration target element 508a, the calibration scan signal 514b may correspond to the first calibration target element 504b and the second calibration target element 508b, the calibration scan signal 514c may correspond to the first calibration target element 504c and the second calibration target element 508c, the calibration scan signal 514d may correspond to the first calibration target element 504d and the second calibration target element 508d, and the calibration scan signal 514e may correspond to the first calibration target element 504e and the second calibration target element 508e.

As described previously herein, the symmetry of the calibration scan signals 514 may be indicative of the fabrication symmetry of the corresponding calibration target elements and thus the asymmetry offsets (e.g., misregistration) between calibration target elements on the second layer 510 with respect to the first layer 506. For example, the calibration scan signal 514a has a symmetric distribution, the calibration scan signals 514b,c have equal and opposite instances of a first asymmetric distribution, and the calibration scan signals 514d,e have equal and opposite instances of a second asymmetric signal.

Further, as illustrated in FIG. 5A, the calibration scan signals 514 may exhibit systematically-varying distributions that correspond to the systematically-varying asymmetry offsets of the calibration target elements on the second layer 510 with respect to the first layer 506. For example, the calibration scan signals 514b-e may exhibit systematic deviations from the calibration scan signal 514a, which may be conceptually illustrated by the conceptual representation 516 in which non-zero asymmetry offsets in equal and opposite directions lead to corresponding deviations of the calibration scan signals 514. Accordingly, calibration scan signals 514 may be characterized with respect to symmetry metrics to provide a mapping between the symmetry metrics and asymmetry offsets (e.g., deviations from symmetry).

Further, it is to be understood that the conceptual representation 516 of calibration scan signals 514 in FIB. 5A is intended to conceptually illustrate systematic deviations of the calibration scan signals 514 rather than specific values of the calibration scan signals 514. For example, the conceptual representation 516 of calibration scan signals 514 in FIG. 5A may reflect, but is not required to reflect, systematic variations of one or more symmetry measurements of the calibration scan signals 514 with respect to one or more symmetry metrics.

The scan signals of an overlay target and/or a calibration sample may be evaluated against any combination of any type of symmetry metric known in the art. In this regard, a mapping between scan signals and asymmetry offsets may be based on the symmetry measurements of the scan signals rather than the actual distribution of the scan signals.

In one embodiment, a scan metric includes a number of peaks in a scan signal. For example, the symmetric calibration scan signal 514a includes a single peak, whereas the asymmetric calibration scan signals 514b-e include multiple (e.g., two) peaks.

In another embodiment, a scan metric includes locations of peaks within the scan signal. For example, the locations of peaks within a scan signal may vary based on the value of the asymmetry offset. In one instance, as illustrated in FIG. 5B, a symmetric calibration scan signal 514a may have a peak centered on the associated symmetrically-stacked overlay target elements (e.g., the 0 position), whereas one or more peaks in an asymmetric calibration scan signals 514b-e may deviate from the 0 position.

In another embodiment, a scan metric includes separations of peaks within the scan signal. For example, the separations of peaks within a scan signal may vary based on the value of the asymmetry offset. In one instance, as illustrated in FIG. 5B, a symmetric calibration scan signal 514a may have a single peak, whereas calibration scan signals 514b,c may include peaks with a first peak separation 518 and calibration scan signals 514d,e may include peaks with a second peak separation 520.

In another embodiment, a scan metric includes values of peaks within the scan signal. For example, the values of peaks within a scan signal may vary based on the value of the asymmetry offset. In one instance, as illustrated in FIG. 5B, a symmetric calibration scan signal 514a may have a single peak with a first peak value, whereas calibration scan signals 514b,c may include peaks with a first peak value and calibration scan signals 514d,e may include peaks with a second peak value and a third peak value.

In another embodiment, a scan metric includes an integral of the scan signal. For example, the integral of a scan signal may vary based on the value of the asymmetry offset.

A mapping between symmetry measurements based on symmetry metrics and corresponding asymmetry offsets may be accomplished using any technique known in the art. For example, scan signals may be analyzed using data fitting and optimization techniques including, but not limited to, libraries, fast-reduced-order models, regression, transform analyses (e.g. Fourier or wavelet transforms, Kalman filters, and the like), dimensionality-reduction algorithms (e.g. principal component analysis (PCA), independent component analysis (ICA), local-linear embedding (LLE), and the like), or sparse representation of data.

In another embodiment, a mapping between scan signals and asymmetry offsets may be generated by training a machine-learning algorithm such as, but not limited to, a neural network, or a support-vector machine (SVM) algorithm. For example, the corresponding asymmetry offsets and any combination of calibration scan signals (e.g., the calibration scan signals 514) or symmetry measurements of the calibration signals based on one or more symmetry metrics may be provided as training signals to the machine learning algorithm. In this regard, the machine-learning algorithm may determine correlations between the asymmetry offsets and associated calibration scan signals and/or symmetry measurements of the calibration scan signals. Once the machine-learning algorithm has been trained, the machine-learning algorithm may determine asymmetry offsets for the sample 118 being measured based on the scan signals generated in step 202 and the mapping generated during the training phase.

In another embodiment, the step 208 includes generating an overlay measurement for the sample layers of interest based on the asymmetry offsets between the overlay target features on the sample layers. As described previously herein, an overlay target may be fabricated with any selected asymmetry offsets of the overlay target elements. Accordingly, the step 208 may include adjusting the asymmetry offsets by a selected value to generate the overlay measurement.

In another embodiment, the method 200 includes a step 210 of providing overlay correctables based on the device-relevant overlay to a lithography system to modify exposure conditions of at least one subsequent exposure.

For example, step 210 may include generating control parameters (or corrections to the control parameters) for fabrication tools such as, but not limited to, lithography tools based on the device-relevant overlay. The control parameters may be generated by a control system such as, but not limited to, the controller 104 of the overlay metrology system 100. The overlay correctables may be provided as part of a feedback and/or a feedforward control loop. In one embodiment, the device-relevant overlay measurements associated with a current process step measured on a sample are used to compensate for drifts of one or more fabrication processes and may thus maintain overlay within selected tolerances across multiple exposures on subsequent samples in the same or different lots. In another embodiment, the device-relevant overlay measurements associated with a current process step may be fed-forward to adjust subsequent process steps to compensate for any measured overlay errors. For example, the exposure of patterns on subsequent layers may be adjusted to match the measured overlay of the subsequent layers.

Systems and methods for overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Pat. No. 7,242,477 titled "APPARATUS AND METHODS FOR DETECTING OVERLAY ERRORS USING SCATTEROMETRY" and issued on Jul. 10, 2007, U.S. Patent Publication No. 2013/0035888 titled "METHOD AND SYSTEM FOR PROVIDING A QUALITY METRIC FOR IMPROVED PROCESS CONTROL" published on Feb. 7, 2013, and U.S. Pat. No. 9,214,317 titled "SYSTEM AND METHOD OF SEM OVERLAY METROLOGY" and issued on Dec. 15, 2015, all of which are incorporated herein by reference in their entirety.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   a controller communicatively coupled to a particle-beam metrology tool, the controller including one or more processors configured to execute program instructions configured to cause the one or more processors to:
      receive a scan signal from the particle-beam metrology tool, wherein the particle-beam metrology tool is configured to scan a particle beam across an overlay target on a sample, the overlay target including a first-layer target element on a first layer of the sample and a second-layer target element on a second layer of the sample fabricated subsequent to the first layer, wherein the particle-beam metrology tool is further configured to capture a scan signal associated with interaction of the particle beam with both the first-layer target element and the second-layer target element;
      determine one or more symmetry measurements for the scan signal with respect to one or more symmetry metrics; and
      generate an overlay measurement between the first layer and the second layer based on the one or more symmetry measurements, wherein an asymmetry of the scan signal is indicative of a misalignment of the second-layer target element with respect to the first-layer target element, wherein a value of the overlay measurement is based on the one or more symmetry measurements.

2. The overlay metrology system of claim 1, wherein the one or more processors are further configured to execute program instructions to cause the one or more processors to provide overlay correctables based on the value of the overlay measurement to a lithography system to modify exposure conditions of at least one subsequent exposure.

3. The overlay metrology system of claim 1, wherein the scan signal comprises:
   at least one of a backscattered particle beam signal or a secondary emission signal.

4. The overlay metrology system of claim 1, wherein the one or more processors are further configured to:
   receive a calibration dataset including one or more calibration scan signals generated by the particle-beam metrology tool based on one or more known overlay configurations of the first-layer target element and the second-layer target element on one or more calibration samples; and
   determine one or more calibration symmetry measurements for the one or more calibration scan signals based on the one or more symmetry metrics, wherein generating the overlay measurement comprises:
   determining the value of the overlay measurement based on a comparison of the one or more symmetry measurements with the calibration symmetry measurements.

5. The overlay metrology system of claim 4, wherein determining the value of the overlay measurement based on a comparison of the one or more symmetry measurements with the calibration symmetry measurements comprises:
   determining the value of the overlay measurement based on a comparison of the one or more symmetry measurements with the calibration symmetry measurements using a pattern comparison technique.

6. The overlay metrology system of claim 4, wherein determining the value of the overlay measurement based on a comparison of the one or more symmetry measurements with the calibration symmetry measurements comprises:
   determining the value of the overlay measurement based on a comparison of the one or more symmetry measurements with the calibration symmetry measurements using a machine learning technique.

7. The overlay metrology system of claim 1, wherein the one or more symmetry metrics include a number of peaks in the scan signal.

8. The overlay metrology system of claim 1, wherein the one or more symmetry metrics include locations of peaks of the scan signal.

9. The overlay metrology system of claim 8, wherein the one or more symmetry metrics include locations of peaks of the scan signal with respect to a center position of the scan signal.

10. The overlay metrology system of claim 1, wherein the one or more symmetry metrics include separation distances between two or more peaks of the scan signal.

11. The overlay metrology system of claim 1, wherein the one or more symmetry metrics include an integral of the scan signal.

12. The overlay metrology system of claim 1, wherein an energy of the particle beam is selected to provide an interaction depth in a sample matching a depth of the first-layer target element.

13. The overlay metrology system of claim 1, wherein the first-layer target element is one of a set of first-layer target elements, wherein the second-layer target element is one of a set of second-layer target elements, wherein the scan signal received by the controller is one of a set of scan signals received by the controller associated with the set of first-layer target elements and the set of second-layer target elements, wherein the one or more processors are further configured to execute program instructions causing the one or more processors to:
  determine a set of symmetry measurements for the set of scan signals with respect to the one or more symmetry metrics; and
  generate an overlay measurement between the first layer and the second layer based on the set of symmetry measurements.

14. The overlay metrology system of claim 1, wherein the set of first-layer target elements are distributed with a first pitch, wherein the set of second-layer target elements are distributed with a second pitch.

15. The overlay metrology system of claim 14, wherein the first pitch equals the second pitch.

16. The overlay metrology system of claim 14, wherein the first pitch and the second pitch are different.

17. An overlay metrology system comprising:
  a particle-beam metrology tool configured to scan a particle beam across an overlay target on a sample, the overlay target including a first-layer target element on a first layer of the sample and a second-layer target element on a second layer of the sample fabricated subsequent to the first layer, the particle-beam metrology tool further configured to capture a scan signal associated with interaction of the particle beam with both the first-layer target element and the second-layer target element; and
  a controller communicatively coupled to the particle-beam metrology tool, the controller including one or more processors configured to execute program instructions configured to cause the one or more processors to:
    receive the scan signal from the particle-beam metrology tool;
    determine one or more symmetry measurements for the scan signal with respect to one or more symmetry metrics; and
    generate an overlay measurement between the first layer and the second layer based on the one or more symmetry measurements, wherein an asymmetry of the scan signal is indicative of a misalignment of the second-layer target element with respect to the first-layer target element, wherein a value of the overlay measurement is based on the one or more symmetry measurements.

18. The overlay metrology system of claim 17, wherein the one or more processors are further configured to execute program instructions to cause the one or more processors to provide overlay correctables based on the value of the overlay measurement to a lithography system to modify exposure conditions of at least one subsequent exposure.

19. The overlay metrology system of claim 17, wherein the particle-beam metrology tool comprises:
  an electron-beam metrology tool.

20. The overlay metrology system of claim 17, wherein the particle-beam metrology tool comprises:
  a focused ion beam metrology tool.

21. The overlay metrology system of claim 17, wherein the scan signal comprises:
  at least one of a backscattered particle beam signal or a secondary emission signal.

22. The overlay metrology system of claim 17, wherein the one or more processors are further configured to:
  receive a calibration dataset including one or more calibration scan signals generated by the particle-beam metrology tool based on one or more known overlay configurations of the first-layer target element and the second-layer target element on one or more calibration samples; and
  determine one or more calibration symmetry measurements for the one or more calibration scan signals based on the one or more symmetry metrics, wherein generating the overlay measurement comprises:
    determining the value of the overlay measurement based on a comparison of the one or more symmetry measurements with the calibration symmetry measurements.

23. The overlay metrology system of claim 22, wherein determining the value of the overlay measurement based on a comparison of the one or more symmetry measurements with the calibration symmetry measurements comprises:
  determining the value of the overlay measurement based on a comparison of the one or more symmetry measurements with the calibration symmetry measurements using a pattern comparison technique.

24. The overlay metrology system of claim 22, wherein determining the value of the overlay measurement based on a comparison of the one or more symmetry measurements with the calibration symmetry measurements comprises:
  determining the value of the overlay measurement based on a comparison of the one or more symmetry measurements with the calibration symmetry measurements using a machine learning technique.

25. The overlay metrology system of claim 17, wherein the one or more symmetry metrics include a number of peaks in the scan signal.

26. The overlay metrology system of claim 17, wherein the one or more symmetry metrics include locations of peaks of the scan signal.

27. The overlay metrology system of claim 26, wherein the one or more symmetry metrics include locations of peaks of the scan signal with respect to a center position of the scan signal.

28. The overlay metrology system of claim 17, wherein the one or more symmetry metrics include separation distances between two or more peaks of the scan signal.

29. The overlay metrology system of claim 17, wherein the one or more symmetry metrics include an integral of the scan signal.

30. The overlay metrology system of claim 17, wherein an energy of the particle beam is selected to provide an interaction depth in a sample matching a depth of the first-layer target element.

31. The overlay metrology system of claim 17, wherein the first-layer target element is one of a set of first-layer target elements, wherein the second-layer target element is one of a set of second-layer target elements, wherein the scan signal received by the controller is one of a set of scan signals received by the controller associated with the set of first-layer target elements and the set of second-layer target elements, wherein the one or more processors are further configured to execute program instructions causing the one or more processors to:
  determine a set of symmetry measurements for the set of scan signals with respect to the one or more symmetry metrics; and
  generate an overlay measurement between the first layer and the second layer based on the set of symmetry measurements.

32. The overlay metrology system of claim 17, wherein the set of first-layer target elements are distributed with a first pitch, wherein the set of second-layer target elements are distributed with a second pitch.

33. The overlay metrology system of claim 32, wherein the first pitch equals the second pitch.

34. The overlay metrology system of claim 32, wherein the first pitch and the second pitch are different.

35. An overlay metrology method comprising:
- scanning a particle beam across an overlay target on a sample, the overlay target including a first-layer target element on a first layer of the sample and a second-layer target element on a second layer of the sample fabricated subsequent to the first layer;
- capturing a scan signal associated with interaction of the particle beam with both the first-layer target element and the second-layer target element;
- determining one or more symmetry measurements for the scan signal with respect to one or more symmetry metrics;
- generating an overlay measurement between the first layer and the second layer based on the one or more symmetry measurements, wherein an asymmetry of the scan signal is indicative of a misalignment of the second-layer target element with respect to the first-layer target element, wherein a value of the overlay measurement is based on the one or more symmetry measurements; and
- providing overlay correctables based on the value of the overlay measurement to a lithography system to modify exposure conditions of at least one subsequent exposure.

* * * * *